US010615058B2

United States Patent
Godet et al.

(10) Patent No.: US 10,615,058 B2
(45) Date of Patent: Apr. 7, 2020

(54) APPARATUS FOR FIELD GUIDED ACID PROFILE CONTROL IN A PHOTORESIST LAYER

(71) Applicant: Applied Materials, Inc., Santa Clara, CA (US)

(72) Inventors: Ludovic Godet, Sunnyvale, CA (US); Christine Y. Ouyang, Santa Clara, CA (US); Viachslav Babayan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 470 days.

(21) Appl. No.: 15/448,060

(22) Filed: Mar. 2, 2017

(65) Prior Publication Data

US 2018/0190518 A1 Jul. 5, 2018

Related U.S. Application Data

(60) Provisional application No. 62/440,016, filed on Dec. 29, 2016.

(51) Int. Cl.
| | |
|---|---|
| *G03D 5/00* | (2006.01) |
| *H01L 21/67* | (2006.01) |
| *H01L 21/027* | (2006.01) |
| *H01L 21/687* | (2006.01) |
| *H01L 21/683* | (2006.01) |

(52) U.S. Cl.
CPC .... *H01L 21/67069* (2013.01); *H01L 21/0273* (2013.01); *H01L 21/67103* (2013.01); *H01L 21/67126* (2013.01); *H01L 21/67248* (2013.01); *H01L 21/67253* (2013.01); *H01L 21/6838* (2013.01); *H01L 21/68785* (2013.01)

(58) Field of Classification Search
USPC .......................................................... 396/611
See application file for complete search history.

(56) References Cited

U.S. PATENT DOCUMENTS

| | | | |
|---|---|---|---|
| 6,261,744 | B1 | 7/2001 | Yoshioka |
| 6,686,132 | B2 | 2/2004 | Cheng et al. |
| 6,841,342 | B2 | 1/2005 | Nishi et al. |
| 6,875,466 | B2 | 4/2005 | Matsui et al. |
| 7,541,137 | B2 | 6/2009 | Beach |

(Continued)

FOREIGN PATENT DOCUMENTS

| | | |
|---|---|---|
| KR | 10-2004-0060413 | 7/2004 |
| KR | 10-2009-0044420 | 5/2009 |

OTHER PUBLICATIONS

International Search Report and Written Opinion for International Application No. PCT/US2017/060298 dated Feb. 27, 2018.

*Primary Examiner* — Rodney E Fuller
(74) *Attorney, Agent, or Firm* — Patterson + Sheridan LLP

(57) ABSTRACT

A process chamber having moveable electrodes for generating a parallel field within a process volume filled with a fluid is provided. In one implementation, a major axis of the process chamber is oriented vertically and a substrate support is disposed opposite a plurality of moveable electrodes extending along the major axis of the process chamber. In certain implementations, the substrate support is electrically floating and capable of rotating about a minor axis of the process chamber during processing of a substrate.

20 Claims, 5 Drawing Sheets

(56) References Cited

U.S. PATENT DOCUMENTS

| | | | |
|---|---|---|---|
| 7,864,502 B2* | 1/2011 | Boyd | H01L 21/67069 |
| | | | 361/230 |
| 8,097,402 B2 | 1/2012 | Scheer et al. | |
| 8,288,174 B1 | 10/2012 | Rathsack et al. | |
| 9,823,570 B2* | 11/2017 | Godet | G03F 7/38 |
| 9,958,782 B2* | 5/2018 | Hanson | C23C 16/54 |
| 10,203,604 B2* | 2/2019 | Babayan | G03F 7/2035 |
| 2003/0032302 A1* | 2/2003 | Nishi | G03F 7/38 |
| | | | 438/758 |
| 2005/0074706 A1 | 4/2005 | Bristol et al. | |
| 2006/0078677 A1* | 4/2006 | Won | C23C 8/36 |
| | | | 427/248.1 |
| 2008/0050679 A1 | 2/2008 | Salek et al. | |
| 2008/0135207 A1 | 6/2008 | Fukuoka et al. | |
| 2008/0156641 A1 | 7/2008 | Pietzner et al. | |
| 2008/0304940 A1 | 12/2008 | Auer-Jongepier et al. | |
| 2013/0337605 A1 | 12/2013 | Kang et al. | |
| 2016/0109813 A1 | 4/2016 | Nam et al. | |
| 2016/0139503 A1 | 5/2016 | Ramaswamy et al. | |
| 2016/0291476 A1 | 10/2016 | Godet et al. | |
| 2016/0357107 A1 | 12/2016 | Buchberger, Jr. et al. | |
| 2017/0365493 A1* | 12/2017 | Zhang | H05B 1/0233 |
| 2018/0004094 A1* | 1/2018 | Hanson | C23C 16/54 |

* cited by examiner

APPARATUS FOR FIELD GUIDED ACID PROFILE CONTROL IN A PHOTORESIST LAYER

CROSS-REFERENCE TO RELATED APPLICATIONS

This application claims benefit of U.S. Provisional Patent Application No. 62/440,016, filed Dec. 29, 2016, the entirety of which is herein incorporated by reference.

BACKGROUND

Field

Implementations of the present disclosure generally relate to apparatus for processing a substrate. More specifically, implementations described herein relate to apparatus processing a substrate with a photoresist layer disposed thereon.

Description of the Related Art

Integrated circuits have evolved into complex devices that can include millions of components (e.g., transistors, capacitors and resistors) on a single chip. Photolithography may be used to form components on a chip. Generally the process of photolithography involves several stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent may then be removed in a pre-exposure bake process.

In an exposure stage, a photomask or reticle may be used to selectively expose certain regions of a photoresist layer disposed on the substrate to electromagnetic radiation. Other exposure methods may be maskless exposure methods. Exposure to light may decompose the photoacid generator, which generates acid and results in a latent acid image (defined at least in part by "latent image lines") in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during the subsequent development process.

After the post-exposure bake, the substrate, and, particularly, the photoresist layer may be developed and rinsed. After development and rinsing, a patterned photoresist layer is then formed on the substrate in order to transfer the pattern to an underlying material layer exposed by openings in the patterned photoresist layer via various etching processes. However, inaccurate control or low resolution of the lithography exposure process may result in the photoresist layer having being formed with undesirable dimensions, such as unacceptable line width roughness (LWR). Furthermore, during the exposure process, acid generated from the photoacid generator may diffuse randomly, including into regions under the mask where such acid is not intended to be diffused. This unintended diffusion may create undesired wiggling and/or an undesired roughness profile at the interface of the patterned photoresist layer with the openings. Line width roughness (LWR) and undesired profiles of the photoresist layer may result in inaccurate feature transfer to the underlying material layer which may lead to device failure and/or yield loss.

Therefore, there is a need for apparatus and methods to improve profile control in a photoresist layer.

SUMMARY

In one implementation, an apparatus for processing a substrate is provided. The apparatus includes a chamber body defining a process volume having sidewalls. A major axis of the process volume is oriented vertically and a minor axis of the process volume is oriented horizontally. A moveable door is coupled to the chamber body, a vacuum chuck is coupled to the door, and a sliding seal is coupled to sidewalls of the chamber body and at least partially defining a portion of the process volume. A plurality of moveable electrodes are disposed in the process volume opposite the vacuum chuck and a plurality of shafts extend from the plurality of electrodes. The shafts extend through the sliding seal and a motor is coupled to the plurality of shafts.

In another implementation, an apparatus for processing a substrate is provided. The apparatus includes a chamber body defining a process volume having sidewalls, a first plurality of fluid ports formed in the sidewalls of the chamber body, and a second plurality of fluid ports formed in the sidewalls of the chamber body opposite the first plurality of fluid ports. The apparatus also includes a movable door coupled to the chamber body, a vacuum chuck coupled to the door, a sliding seal coupled to the sidewalls of the chamber body and at least partially defining a portion of the process volume. In addition, the apparatus includes a plurality of movable electrodes disposed in the process volume opposite the vacuum chuck, a plurality of shafts extending from the plurality of electrodes and the shafts extend through the sliding seal, and a motor coupled to the plurality of shafts.

In yet another implementation, an apparatus for processing a substrate is provided. The apparatus includes a chamber body defining a process volume having sidewalls and a major axis of the process volume is oriented vertically and a minor axis of the process volume is oriented horizontally. The apparatus also includes a first plurality of fluid ports formed in the sidewalls of the chamber body and a second plurality of fluid ports formed in the sidewalls of the chamber body opposite the first plurality of fluid ports along the major axis of the process volume. Further, the apparatus includes a movable door coupled to the chamber body, a vacuum chuck having a heating element disposed therein coupled to the door, and a sliding vacuum seal coupled to the sidewalls of the chamber body and at least partially defining a portion of the process volume. In addition, the apparatus includes a plurality of movable electrodes disposed in the process volume opposite the vacuum chuck, a plurality of shafts extending from the plurality of electrodes, the shafts extending through the sliding seal into a cavity disposed opposite the process volume, and a motor coupled to the plurality of shafts.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
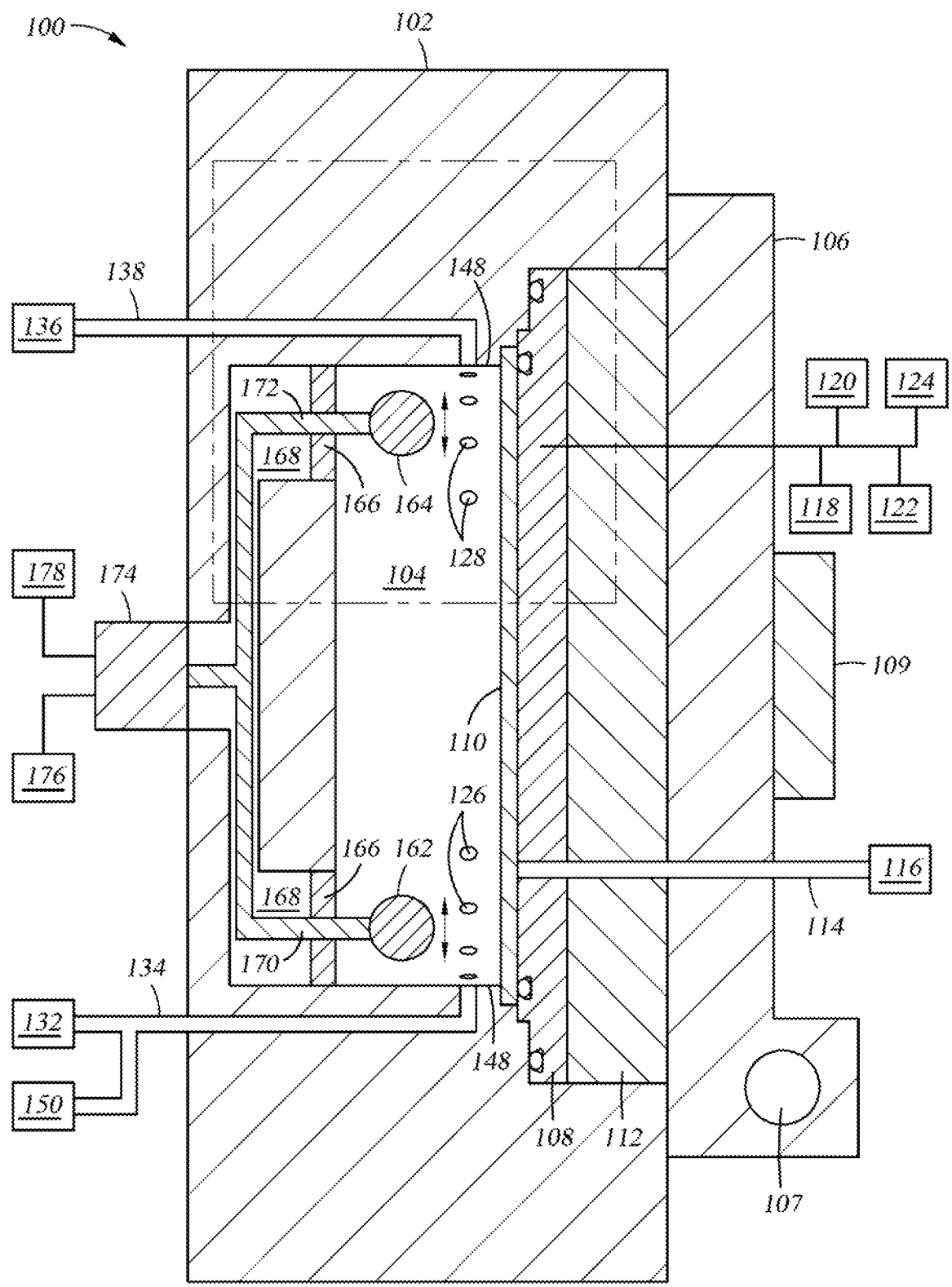
FIG. 1 illustrates a cross-sectional view of a process chamber according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein relate to apparatus and methods for processing a substrate. More specifically, a process chamber having movable electrodes for generating a field parallel to a substrate within a process volume filled with a fluid is provided. In one implementation, a major axis of the process chamber is oriented vertically and a substrate support is disposed opposite a plurality of movable electrodes extending along the major axis of the process chamber. In certain implementations, the substrate support is electrically floating and capable of rotating about a minor axis of the process chamber during processing of a substrate.

FIG. 1 illustrates a schematic, cross-sectional view of a process chamber 100 according to implementations described herein. In one implementation, the process chamber 100 is configured for performing immersion field guided post exposure bake (iFGPEB) processes. The chamber 100 is positioned in a vertical orientation such that when a substrate is being processed, a major axis of the substrate is oriented vertically and a minor axis of the substrate is oriented horizontally. While the illustrated implementations concern the chamber 100 in a vertical orientation, it is contemplated that the chamber 100 may be advantageously implemented with a horizontal orientation. The chamber 100 includes a chamber body 102, which is manufactured from a metallic material, such as aluminum, stainless steel, and alloys and combinations thereof. Alternatively, the chamber body 102 is manufactured from polymer materials, such as polytetrafluoroethylene (PTFE), or high temperature plastics, such as polyether ether ketone (PEEK).

The body 102 defines, at least partially, a process volume 104 therein. For example, a sidewall 148 of the body 102 defines a diameter of the process volume 104. A major axis of the process volume 104 is oriented vertically and a minor axis of the process volume 104 is oriented horizontally. A first plurality of fluid ports 126 are formed in the chamber body 102 through the sidewall 148. A second plurality of fluid ports 128 are also formed in the sidewall 148 of the chamber body 102 opposite the first plurality of fluid ports 126. The first plurality of fluid ports 126 are in fluid communication with a process fluid source 132 via first conduit 134. The second plurality of fluid ports 128 are in fluid communication with a fluid outlet 136 via a second conduit 138. The process fluid source 132, either alone or in combination with other apparatus, is configured to preheat process fluid to a temperature of between about 70° C. and about 130° C., such as about 110° C., prior to the fluid entering the process volume 104.

In one implementation, a purge gas source 150 is also in fluid communication with the process volume 104 via the first fluid conduit 134 and the first plurality of fluid ports 126. Gases provided by the purge gas source 150 may include nitrogen, argon, other inert gases and the like to purge the processing volume 104 during or after iFGPEB processing. In one implementation, purge gas from the purge gas source 150 is provided to the process volume 104 to remove process fluid from the process volume 104. In another implementation, the purge gas may be utilized to dry a substrate after processing the substrate with process fluid. When desired, purge gases may be exhausted from the processing volume 104 via the fluid outlet 136.

A door 106 is operably coupled to the chamber body 102. In the illustrated implementation, the door 106 is oriented in a processing position such that the door 106 is disposed adjacent to and abuts the chamber body 102. The door 106 is formed from materials similar to the materials selected for the chamber body 102. Alternatively, the chamber body 102 may be formed from a first material, such as a polymeric material, and the door 106 may be formed from a second material different from the first material, such as a metallic material. A shaft 107 extends through the door 106 and provides an axis (i.e. the Z-axis) about which the door 106 rotates to open and close the door 106.

The door 106 may be coupled to a track (not shown) and the door 106 is configured to translate along the track in the X-axis. A motor (not shown) may be coupled to the door 106 and/or the track to facilitate movement of the door 106 along the X-axis. Although the door 106 is illustrated in a closed processing position, opening and closing of the door 106 may be performed by moving the door 106 away from the chamber body 102 along the X-axis prior to rotating the door 106 about the Z-axis. For example, the door 106 may rotate about 90° from the illustrated processing position to a loading position such that positioning of a substrate 110 on a vacuum chuck 108 can be performed with a reduced probability of substrate breakage during loading.

A backing plate 112 is coupled to the door 106 and the vacuum chuck 108 is coupled to the backing plate 112. The backing plate 112 is formed from materials similar to the door 106 or the chamber body 102, depending on the desired implementation. The vacuum chuck 108 may be formed from a non-metallic material or other insulative material, such as a ceramic material or the like. In addition, the material utilized for the vacuum chuck 108 may be a non-oxidative material to substantially reduce or prevent the probability of substrate oxidation via reaction of the process fluid with the vacuum chuck 108. The materials utilized for the vacuum chuck 108 provide for desirable current uniformity within the process volume 104. More specifically, the materials utilized for the vacuum chuck are selected to have a negligible influence of the electric field generated within the chamber 100 during processing.

In one implementation, the vacuum chuck 108 is electrically floating. As a result, a substrate 110 disposed on the vacuum chuck 108 is electrically floating. Thus, the substrate 110 is not electrically coupled to any conductive elements of the processing chamber 100 or to a ground. More specifically, electrically floating the substrate 110 helps to shape an electric field into a configuration in which the electric field lines remain substantially parallel to the top (and/or bottom) surface of the substrate 110, which is generally parallel to a substrate supporting surface of the vacuum chuck 108.

The vacuum chuck 108 is sized to accommodate attachment of the substrate 110 thereon. The vacuum chuck 108 is also sized to allow for positioning adjacent the chamber body 102 and the process volume 104. In one implementation, the vacuum chuck 108 is fixed to the backing plate 112 and the door 106. In another implementation, the vacuum chuck 108 is rotatably coupled to the backing plate 112 and the door 106. In this implementation, a motor 109 is coupled to the door 106 and is configured to impart rotational movement on either the backing plate 112 or the vacuum chuck 108.

A vacuum source 116 is in fluid communication with a substrate receiving surface of the vacuum chuck 108. The vacuum source 116 is coupled to a conduit 114 which extends from the vacuum source 116 through the door 106, the backing plate 112, and the vacuum chuck 108. Generally, the vacuum source 116 is configured to vacuum chuck the substrate 110 to the vacuum chuck 108.

In one implementation, a heat source 118, a temperature sensing apparatus 120, an optional electric field influence device 122, and an optional sensing apparatus 124 are coupled to the vacuum chuck 108. The heat source 118 provides power to one or more heating elements, such as resistive heaters or ceramic heaters, disposed within the vacuum chuck 108. It is also contemplated that the heat source 118 provides power to heating elements disposed within the backing plate 112. The heat source 118 is generally configured to heat either the vacuum chuck 108 and/or or the backing plate 112 to facilitate preheating of the substrate 110 and/or fluid during iFGPEB processes. The heat source 118 may also be utilized to maintain a desired temperature of the substrate and/or process fluid during substrate processing in addition to or distinct from preheating the process fluid. In one implementation, the heat source 118 is configured to heat the vacuum chuck 108 to a temperature of between about 70° C. and about 130° C., such as about 110° C.

The temperature sensing apparatus 120, such as a thermocouple or the like, is communicatively coupled to the heat source 118 to provide temperature feedback and facilitate heating of the vacuum chuck 108. The optional electric field influence device 122 is configured to ensure the vacuum chuck 108 remains electrically floating during processing. The optional sensing apparatus 124, such as a voltmeter or the like, is communicatively coupled to the optional electric field influence device 122 to provide electrical feedback.

A plurality of electrodes 162, 164 are disposed within the process volume 104 opposite the vacuum chuck 108. In one implementation, the electrodes 162, 164 are metallic antennas or rods. In another implementation, the electrodes 162, 164 are conductive silicon carbide or graphite and may reduce the probability of metal contamination within the process chamber 100. The electrodes 162, 164 may have any desirable shape, such as a circular cross-section, an oblong cross-section, or a polygonal cross-section. The electrodes 162, 164 extend a length similar to or greater than a diameter of the substrate 110. For example, for a 300 mm diameter substrate, the electrodes 162, 164 may have a length similar to or greater than about 300 mm. A first electrode 162 is disposed adjacent the sidewall 148 which has the first conduit 134 coupled thereto. A second electrode 164 is disposed adjacent the sidewalls 148 which has the second conduit 138 coupled thereto.

While the electrodes 162, 164 are illustrated as being disposed near the sidewall 148 with a spacing between the electrodes 162, 164 proximate the diameter of the substrate 110, it is contemplated that the process volume 104 may be sized such that the electrodes 162, 164 are spaced apart greater than a diameter of the substrate 110. In this example, the electrodes 162, 164 are disposed beyond the diameter of the substrate 110. Accordingly, the sidewall 148 of the process chamber 100 may have a greater diameter to enable positioning of the electrodes 162, 164 beyond the diameter of the substrate 110. Similarly, the vacuum chuck 108 and backing plate 112 may be suitable sized to enable mating of the vacuum chuck 108 to the body 102 when the process volume 104 has a diameter greater than a diameter of the substrate 110.

The first electrode 162 is coupled to a first shaft 170 which extends through a seal 166. Similarly, the second electrode 164 is coupled to a second shaft 172 which extends through the seal 166. The seal 166 is coupled to the body 102 at the sidewall 148 and extends radially inward where the seal 166 couples to a portion of the body disposed between the seal 166. The seal 166 faces and at least partially defines a portion of the process volume 104. As such, the seal 166 is exposed to the conditions maintained within the process volume 104 during processing, including exposure to process fluid and electric fields.

In one implementation, the seal 166 is a sliding vacuum seal. For example, the seal 166 allows for linear movement of the first and second shafts 170, 172 while preventing the passage of fluids from the process volume 104 to reach a cavity 168 located behind the seal 166. It is also contemplated that the seal 166 may prevent particles from entering the process volume 104 from the cavity 168. The seal 166 is formed from materials which are suitable for preventing passage of a fluid therethrough while allowing for movement of the shafts 170, 172. In certain implementations, the seal 166 is formed from one or a plurality of gaskets which are formed from an elastomeric material.

Similar to the seal 166, the cavity 168 is disposed between the sidewall 148 and the portion of the body 102 disposed between the seal 166. The cavity 168 is generally void of obstructions to enable movement of the shafts 170, 172 therein. For example, a width of the cavity 168 is sized to accommodate a stroke length of the electrodes 162, 164 when the electrodes 162, 164 are moved linearly in the process volume 104 (as indicated by the vertical double arrows). The cavity 168 also extends behind the portion of the body 102 disposed between the seal 166 (e.g. opposite the process volume 104) and is sized to enable movement of the electrodes 162, 164 by providing space for a common shaft (where the first shaft 170 and second shaft 172 meet) to translate linearly.

The shafts 170, 172 coupled (via the common shaft) to a motor 174 which is disposed outside of and is coupled to the body 102. The motor 174, which may be coupled to a power source (not shown) is configured to impart linear movement to the shafts 170, 172 and ultimately move the electrodes 162, 164 within the process volume 104. The motor 174 may be a stepper or servo motor or the like. In one implementation, the motor 174 is configured to raster scan in a singular plane (e.g. back and forth linear movement, and in the illustrated implementation, repetitive up and down movement, which may be continuous or step wise, depending upon the desired implementation).

A first power source 176 is electrically coupled to the first electrode 162. For example, a conductive wire or the like may extend from the first power source 176 through the first shaft 170 to the first electrode 162. A second power source 178 is electrically coupled to the second electrode 162. Similar to the first power source 176, a conductive wire or the like may extend from the second power source 178 through the second shaft 172 to the second electrode 164. The first power source 176 is configured to provide electrical current to the first electrode 162 with a first polarity and the second power source 178 is configured to provide electrical current to the second electrode 164 with a second polarity opposite the first polarity. For example, the first electrode 162 may be "positive" while the second electrode 164 is "negative."

Together, the configuration of the electrodes 162, 164 and the fact that the substrate 110 is electrically floating helps to generate a desired electric field configuration. More specifically, the electrodes 162, 164 are configured to generate an electric field parallel to a minor axis of the substrate 110. In other words, the electrodes 162, 164 are configured to generate an electric field normal to the major axis of the substrate 110. The electrical floating of the substrate 110 helps to cause the electric field to be substantially parallel along a substantially large portion of the substrate 110.

The power sources 176, 178 may have various characteristics in order to provide the electric field described above. For example, the power sources 176, 178 may be configured to supply between about 500 V and about 100 kV to the electrodes 162, 164, to generate an electric field having a strength between about 50 V/mm and about 100 MV/m, for example, between about 100 V/mm and about 1 MV/mm, such as about 200 V/mm. In some implementations, either or both of the power sources 176, 178 are direct current (DC) power supply or a pulsed DC power supply. In pulsed DC implementations, pulsed DC waves may be from a half-wave rectifier or a full-wave rectifier. The DC power may have a frequency of between about 10 Hz and 1 MHz. The duty cycle of the pulsed DC power may be from between about 5% and about 95%, such as between about 20% and about 60%. In some implementations, the duty cycle of the pulsed DC power may be between about 20% and about 40%. In other implementations, the duty cycle of the pulsed DC power may be about 60%. The rise and fall time of the pulsed DC power may be between about 1 ns and about 1000 ns, such as between about 10 ns and about 500 ns. In other implementations, the rise and fall time of the pulsed DC power may be between about 10 ns and about 100 ns. In some implementations, the rise and fall time of the pulsed DC power may be about 500 ns.

In some implementations, either or both of the power sources 176, 178 provide an alternating current power supply. The waveform applied by such an alternating current power supply may be a sinusoidal waveform. The frequency of such a sinusoidal waveform may be from between 1 Hz to 1 KHz, although the frequency is not limited to those numbers. This AC waveform may be combined with a pulse, as well. In other implementations, either or both of the power sources 176, 178 are a direct current power supply. In some implementations, either or both of the power sources 176, 178 may use a DC offset. The DC offset may be, for example, between about 0% and about 75% of the applied voltage, such as between about 5% and about 60% of the applied voltage.

The position of the electrodes 162, 164 relative to the substrate 110 is such that a desired field strength is maintained without using excessive power. It is also contemplated that a distance between an edge of the substrate and the electrodes 162, 164 is on the order of several millimeters to minimize the vertical field contribution in generating a horizontal field. While only two electrodes (electrodes 162, 164) are shown, it is contemplated that additional electrodes may be advantageously implemented. For example, multiple additional pairs of electrodes may be utilized. In these implementations, the additional pairs of electrodes are powered such that one electrode of the pair is "positive" and the other electrode of the pair is "negative." The orientation of the electrodes disposed in the process volume 104 is such that adjacent electrodes have opposite polarities. In other words, each electrode in a sequence of electrodes has a polarity opposite an immediately adjacent electrode (e.g. +, −, +, −).

Moving the electrodes 162, 164 while the electric field and heat is applied helps to cause charged species (acid) in a resist disposed on the substrate 110 to move in a desired direction, allowing the interfaces defined by a latent image to be smoother than if no electric field were applied. It is contemplated that the electrodes may be moved in a manner to avoid creating turbulence of the process fluid in order to prevent generation of bubbles with a different dielectric constant than the dielectric constant of the process fluid. Moreover, it is believed that movement of the electrodes 162, 164 helps to average out non-uniformities in the electric field adjacent the electrodes 162, 164. As a result of the aforementioned electrode arrangement and movement, acid generated upon exposure of a resist disposed on the substrate 110 may be modulated during iFGPEB processing to improve patterning and resist de-protection characteristics.

Figure 2:
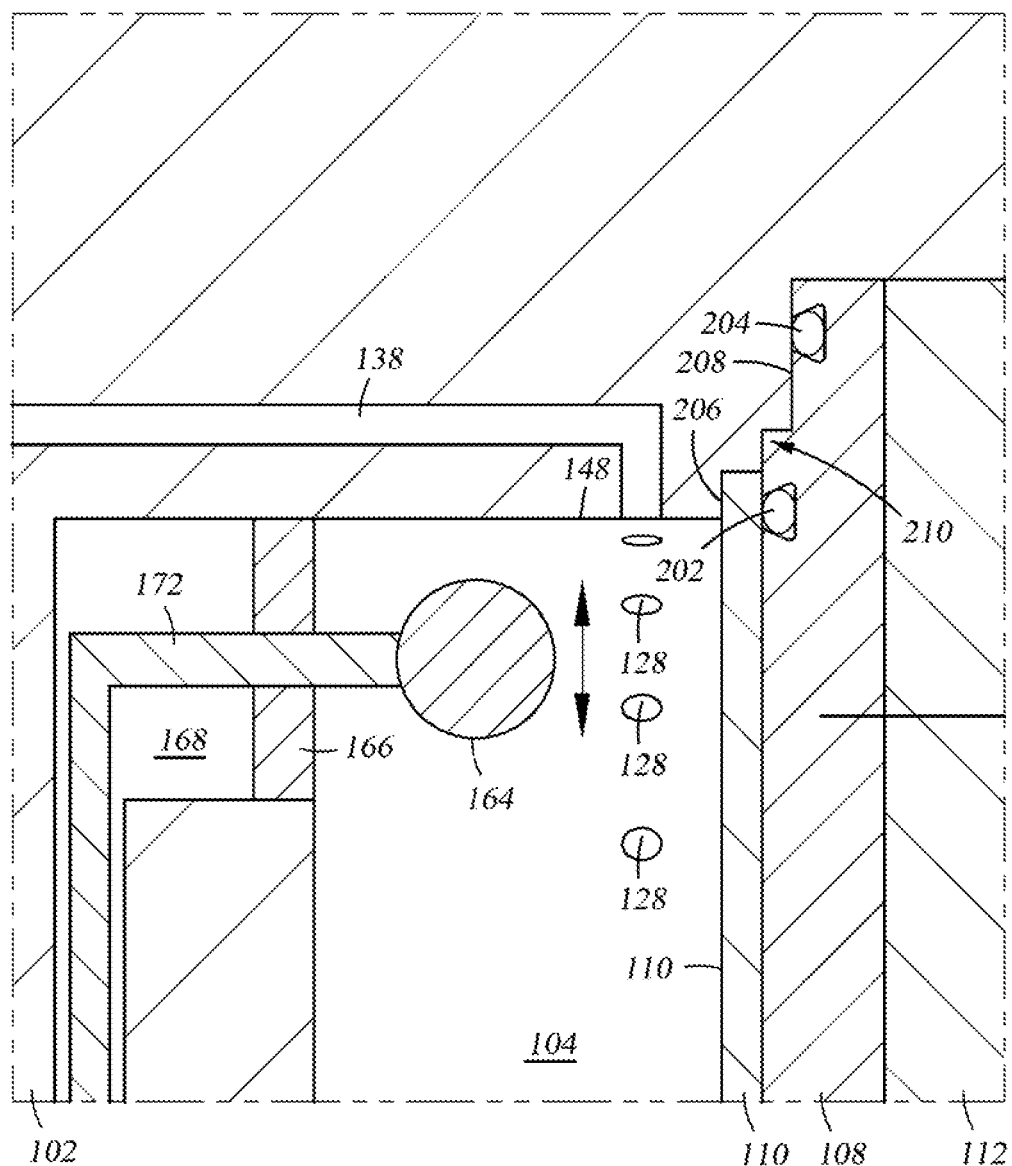
FIG. 2 illustrates a detailed view of a portion of the process chamber of FIG. 1 according to implementations described herein.

FIG. 2 illustrates a detailed view of a portion of the process chamber 100 of FIG. 1 according to implementations described herein. In operation, the process volume 104 is filled with process fluid during iFGPEB processing. To reduce the probability of process fluid leakage out of the process volume, a plurality of O-rings are utilized to maintain the fluid containment integrity of the process volume. A first O-ring 202 is disposed in the vacuum chuck 108 on the substrate receiving surface of the vacuum chuck 108. The first O-ring 202 may be positioned on the vacuum chuck 108 radially inward from an outer diameter of the substrate 110.

In one example, the first O-ring 202 is positioned on the vacuum chuck 108 a distance between about 1 mm and about 10 mm radially inward from the outer diameter of the substrate 110. The first O-ring is positioned to contact the backside of the substrate 110 when the substrate is chucked to the vacuum chuck 108. A first surface 206 of the sidewall 148 is shaped and sized to contact an edge region of the substrate 110 when the substrate 110 is in the illustrated processing position.

In another example, the first surface 206 of the sidewall does not contact the edge region of the substrate 110 when the substrate 110 is disposed in the processing position. In this example, the sidewall 148, which as least partially defines the process volume 104, has a diameter greater than a diameter of the substrate 110. This implementation provides for an increased area within the process volume 104 for the electrodes 162, 164 to move and provides sufficient area from the electrodes 162, 164 to move beyond a diameter of the substrate 110. In this implementation, it is contemplated that the field influence may be more profound at or near regions adjacent a circumference of the substrate 110 to further improve patterning and resist de-protection characteristics.

In one implementation, the first O-ring 202 is disposed in the vacuum chuck 108 opposite the first surface 206 of the sidewall 148. It is contemplated that the first O-ring 202 may prevent the leakage of process fluid from the process volume 104 to a region behind the substrate 110, such as the substrate supporting surface of the vacuum chuck 108. Advantageously, vacuum chucking of the substrate 110 is maintained and process fluid is prevented from reaching the vacuum source 116.

The vacuum chuck 108 has a ledge 210 disposed radially outward of the first O-ring. The ledge 210 is disposed radially outward from the position of the first O-ring 202. A second O-ring 204 is coupled to the vacuum chuck 108 radially outward of the ledge 210. A second surface 208 of the sidewall 148 is shaped and sized to contact the vacuum chuck 108 adjacent to and extending radially inward from the outer diameter of the vacuum chuck 108. In one implementation, the second O-ring 204 is disposed in contact with the second surface 208 of the sidewall 148 when the substrate 110 is disposed in a processing position. It is contemplated that the second O-ring 204 may prevent the leakage of process fluid from the process volume 104 beyond the outer diameter of the vacuum chuck 108.

Each of the O-rings 202, 204 are formed from an elastomeric material, such as a polymer or the like. In one implementation, the O-rings 202, 204 have a circular cross-section. In another implementation, the O-rings 202, 204 have a non-circular cross-section, such as a triangular cross section or the like. It is also contemplated that each of the O-rings 202, 204 are subjected to a compressive force suitable to prevent the passage of process fluid beyond the O-rings 202, 204 and fluidly seal the process volume 104.

Figure 3:
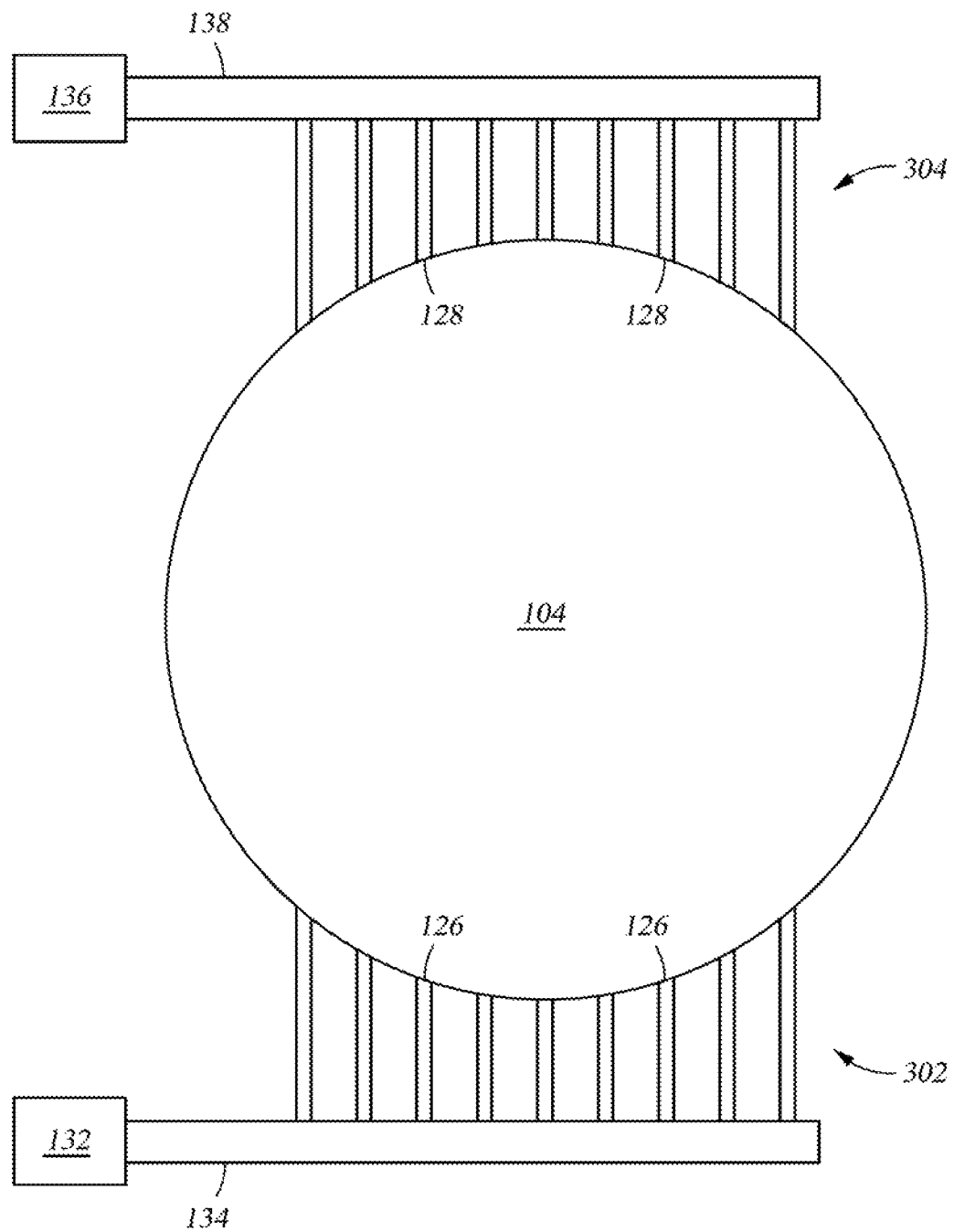
FIG. 3 illustrates a schematic, side view of various components of the process chamber of FIG. 1 according to implementations described herein.

FIG. 3 illustrates a schematic, side view of various components of the process chamber 100 of FIG. 1 according to implementations described herein. The process volume 104 is illustrated with the first plurality of fluid ports 126 and the second plurality of fluid ports 128 formed therein. A first plurality of channels 302 are coupled between the first plurality of fluid ports 126 and the first conduit 134. A second plurality of channels 304 are coupled between the second plurality of fluid ports 128 and the second conduit 138.

While 10 channels of the first plurality of channels 302 are illustrated, it is contemplated that between about 5 channels and about 30 channels may be implemented, for example, between about 9 channels and about 21 channels. Similarly, between about 5 channels and about 30 channels may be utilized for the second plurality of channels 304, for example, between about 9 channels and about 21 channels. The number of channels 302, 304 is selected to enable suitable fluid flow rates during filling of the process volume 104. The channels 302, 304 are also configured to maintain the rigidity of the process volume 104 when the vacuum chuck 108 and substrate 110 are positioned against the first surface 206 of the chamber body 102. In one implementation, 9 first channels 302 and 9 second channels 304 are coupled to the process volume 104. In another implementation, 21 first channels 302 and 21 second channels 304 are coupled to the first process volume 104.

The first plurality of channels 302 and the second plurality of channels 304 are formed in the body 102 of the process chamber 100. Each of the first and second plurality of channels 302, 304 has a diameter at the first fluid ports 126 and second fluid ports 128, respectively, of between about 3.0 mm and about 3.5 mm, such as about 3.2 mm. In another implementation, the diameter of each channel along the diameter of the process volume 104 is different. In one implementation, the channels of the first plurality of channels 302 are evenly spaced across the diameter of the process volume 104. Similarly, the channels of the second plurality of channels 304 are evenly spaced across the diameter of the process volume 104. It is also contemplated that the channels of the first and second plurality of channels 302, 304 may also be unevenly spaced across the diameter of the process volume 104.

The spacing of the channels of the first and second plurality of channels 302, 304 is configured to reduce turbulence of the process fluid entering and exiting the process volume 104. Because turbulence generates bubbles in the process fluid and bubbles act as insulators within the subsequently applied electric field, measures are taken to reduce the formation of bubbles. As described in detail below, flow rates of process fluid are modulated, in combination with the design of the first and second plurality of channels 302, 304, to reduce turbulence.

A flow path of process fluid originates from the process fluid source 132 and travels through the first conduit 134 into the first plurality of channels 302. The fluid exits the first plurality of channels 302 via the first fluid ports 126 into the process volume 104. Once the process volume 104 is filled with process fluid, the process fluid exits the process volume 104 via the second fluid ports 128 into the second plurality of channels 304. The process fluid continues into the second conduit 138 and is ultimately removed from the process chamber 100 in the fluid outlet 136.

In one operational implementation, a first flow rate utilized to fill the process volume 104 with process fluid prior to activation of an electric field is between about 5 L/min and about 10 L/min. Once the process volume 104 is filled with process fluid, the electric field is applied and a second flow rate of process fluid between about 0 L/min and about 5 L/min is utilized during iFGPEB processing. The process fluid fill and processing time is between about 30 seconds and about 90 seconds, such as about 60 seconds. In one implementation, process fluid continues to flow during iFGPEB processing. In this implementation, the volume of the process volume 104 is exchanged between about 1 time and about 10 times per substrate processed. In another implementation, the process fluid is predominantly static during processing. In this implementation, the volume of the process volume 104 is not exchanged during substrate processing of each substrate.

In another operational implementation, a first flow rate is utilized to initially fill the process volume 104. The first flow rate is less than 5 L/min for an amount of time to fill the process volume 104 such that the first fluid ports 126 are submerged. A second flow rate of greater than 5 L/min is then utilized to fill the remainder of the process volume 104. During application of electric field in iFGPEB processing, a third flow rate of less than 5 L/min is utilized. The flow rate modulation between the first and second flow rates is configured to reduce turbulence of the fluid within the process volume 104 and reduce or eliminate the formation of bubbles therein. However, if bubbles are formed, the buoyancy of the bubbles enables the bubbles to escape from the process volume 104 via the second fluid ports 128, thereby minimizing the insulating effect of the bubbles on the electric field during iFGPEB processing. Accordingly, a more uniform electric field may be achieved to improve iFGPEB processing.

Figure 4A:
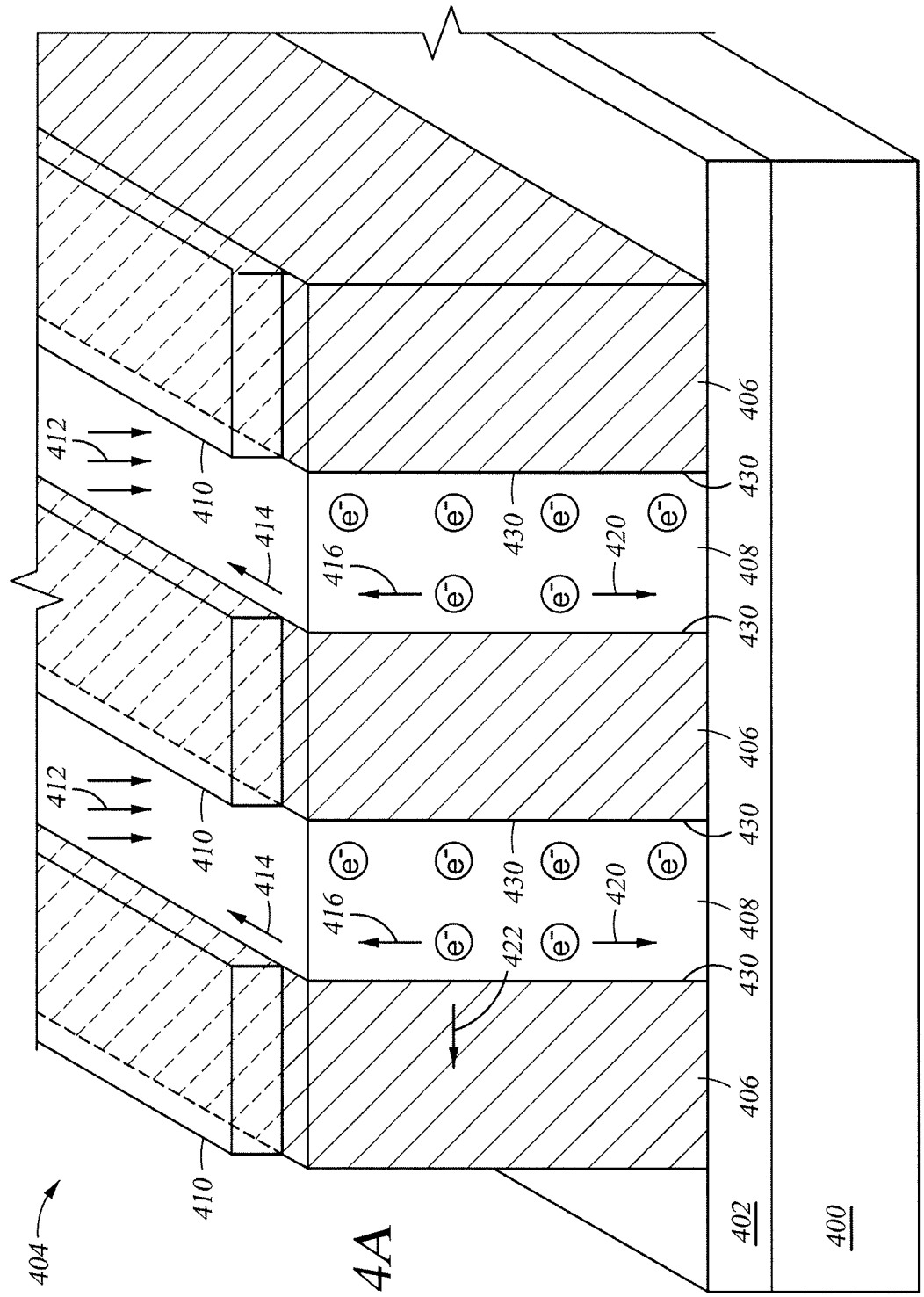
FIGS. 4A-4B illustrate an acid distribution control of a photoresist layer during an exposure process according to implementations described herein.

FIG. 4A depicts a photoresist layer 404 disposed on a material layer 402 formed on a substrate 400 during a lithography exposure process. As discussed above, an electric field from the electrodes 162, 164 is applied during a post exposure baking process. During the lithographic exposure process, radiation 412 is directed to a first region 408 of the photoresist layer 404 while with a second region 406 of the photoresist layer 404 protected by a photomask 410. Photoacid, shown as e⁻ in FIG. 4A, is generated in the exposed first region 408 in the photoresist layer 404 when photoacid generator (PAG) is exposed to the radiation 412, such as a ultraviolet (UV) radiation. Although FIG. 4A illustrates the photoacid with an "e⁻" symbol, this is not specifically reflective of the actual charge of photoacid compounds, but of the fact that photoacid compounds generally are electrically charged.

In a conventional process, photoacid is primarily generated in the exposed first region 408 of the photoresist layer 404 during the light exposure process. During the post-exposure bake period, movement of photoacid is generally random and the interface between areas within the photoresist layer 404 that include the generated photoacid and areas that do not include the generated photoacid may comprise an unclear boundary (i.e., interface 430). For example, the random movement may result in at least a portion of the photoacid diffusing into the second region 406, as shown in the arrow 422. Such photoacid drift may result in line edge roughness, resolution loss, photoresist footing, and profile deformation, which may cause inaccurate transfer of features to the underlying material layer 402. This inaccurate transfer of features could lead to device failure.

By applying the electric field described above to the photoresist layer 404 during the post-exposure bake process, distribution of photoacid in the exposed first region 408 may be efficiently controlled and confined. The electric field as applied to the photoresist layer 404 may move photoacid in vertical directions (e.g., the y-direction shown by arrows 416 and 420, which is substantially perpendicular to the planar surface of the substrate 400) with minimal lateral motion (e.g., x direction shown by the arrow 422). That is, the photoacid generally does not diffuse into the adjacent second region 406. Generally, photoacid has a certain polarity that may be affected by an electric field applied thereto. Such an applied electric field will orient photoacid molecules in directions that are in accordance with the electric field. When such electric field is applied, the photoacid moves in a desired direction such that the photoacid generally does not cross into the second region 406.

In another implementation, the substrate 110 may also be oriented with latent image lines relative to the electrodes 162, 164 such that photoacid is moved in a horizontal directions (e.g. the z-direction 414) to improve line edge roughness. Thus, it is contemplated that the orientation of the substrate 110 and the electrodes 162, 164 may be utilized in various combinations to provide for improved patterning and resist de-protection characteristics.

Figure 4B:
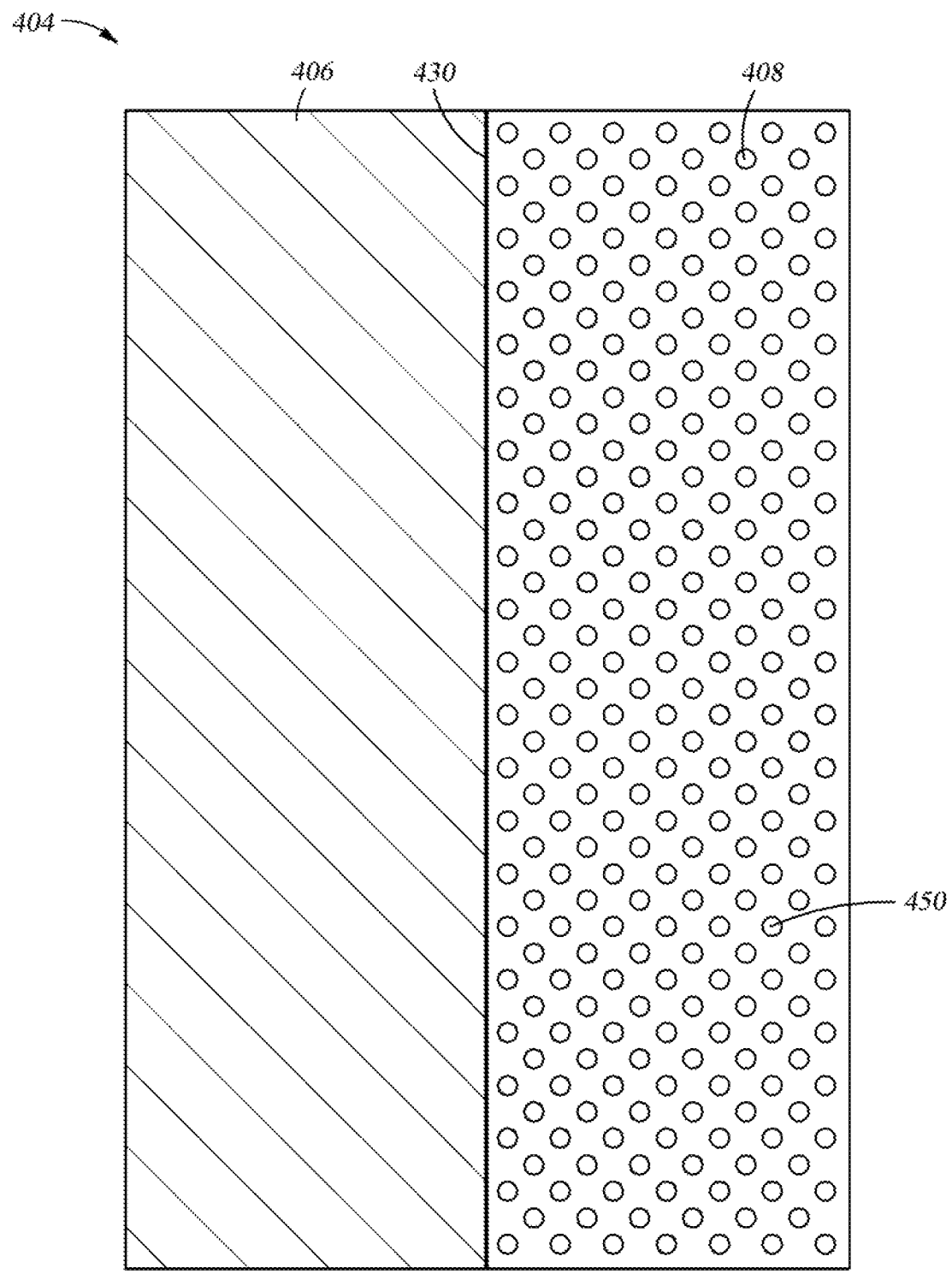

FIG. 4B depicts a top view of the photoresist layer 404 including a portion of the first region 408 and the second region 406 delineated by the interface 430. After the electric and/or magnetic field is applied to the photoresist layer 404, distribution of photoacid 450 is generally constrained to the first region 408 without diffusing cross to the second region 406. Thus, by applying the electric field and/or magnetic field as described above, a clearly defined interface 430 may be obtained, thus forming a patterned photoresist layer with a sharp profile, a high resolution and reduced line edge roughness and defects.

In summation, apparatus and methods for improving iFGPEB processing are provided. The process chamber described herein enables efficient use of process fluid and improved application of electric field during iFGPEB operations. The movable electrodes and other aspects of the process chamber provide for improved field distribution and uniformity, thereby enabling improved photoresist development with improved resolution and reduced line roughness profiles. Thus, iFGPEB processing operations can be improved by utilizing the apparatus and methods described herein.

While the foregoing is directed to implementations of the present disclosure, other and further implementations of the disclosure may be devised without departing from the basic scope thereof, and the scope thereof is determined by the claims that follow.

What is claimed is:

1. An apparatus for processing a substrate, comprising:
a chamber body defining a process volume having sidewalls, wherein a major axis of the process volume is oriented vertically and a minor axis of the process volume is oriented horizontally;
a moveable door coupled to the chamber body;
a vacuum chuck coupled to the door;
a sliding seal coupled to sidewalls of the chamber body and at least partially defining a portion of the process volume;
a plurality of moveable electrodes disposed in the process volume opposite the vacuum chuck, the plurality of moveable electrodes adapted to generate an electric field parallel to the major axis of the process volume;
a plurality of shafts extending from the plurality of electrodes, the shafts extending through the sliding seal; and
a motor coupled to the plurality of shafts.

2. The apparatus of claim 1, further comprising:
a backing plate disposed between the vacuum chuck and the door.

3. The apparatus of claim 1, wherein the moveable electrodes are made from one or more metallic materials.

4. The apparatus of claim 1, wherein the moveable electrodes are made from a silicon carbide material.

5. The apparatus of claim 1, wherein the moveable electrodes are made from a graphite containing material.

6. The apparatus of claim 1, wherein the moveable electrodes are shaped as rods and have a circular cross-section.

7. The apparatus of claim 1, further comprising:
a first plurality of fluid ports formed in the sidewalls of the chamber body, wherein the first plurality of fluid ports are in fluid communication with a first conduit.

8. The apparatus of claim 7, further comprising:
a second plurality of fluid ports formed in the sidewalls of the chamber body, wherein the second plurality of fluid ports are in fluid communication with a fluid outlet via a second conduit.

9. The apparatus of claim 8, wherein the second plurality of fluid ports are disposed opposite the first plurality of fluid ports along the major axis of the process volume.

10. The apparatus of claim 1, wherein the sliding seal is a sliding vacuum seal.

11. The apparatus of claim 1, wherein the sliding vacuum seal comprises a plurality of elastomeric gaskets.

12. The apparatus of claim 1, wherein the motor coupled to the plurality of shafts is operable to move the electrodes parallel to the major axis of the process volume.

13. The apparatus of claim 1, further comprising:
a rotational motor coupled to the vacuum chuck.

14. The apparatus of claim 1, further comprising:
a rotational motor coupled to the backing plate.

15. The apparatus of claim 1, further comprising:
heating elements disposed in the vacuum chuck.

16. The apparatus of claim 1, wherein at least a portion of the plurality of shafts are disposed in a cavity disposed opposite the process volume, wherein the cavity is defined by the sidewalls and the chamber body.

17. An apparatus for processing a substrate, comprising a chamber body defining a process volume having sidewalls;
   a first plurality of fluid ports formed in the sidewalls of the chamber body;
   a second plurality of fluid ports formed in the sidewalls of the chamber body opposite the first plurality of fluid ports;
   a moveable door coupled to the chamber body;
   a vacuum chuck coupled to the door;
   a sliding seal coupled to sidewalls of the chamber body and at least partially defining a portion of the process volume;
   a plurality of moveable electrodes disposed in the process volume opposite the vacuum chuck;
   a plurality of shafts extending from the plurality of electrodes, the shafts extending through the sliding seal; and
   a motor coupled to the plurality of shafts.

18. The apparatus of claim 17, wherein the sliding seals is disposed between the process volume and a cavity disposed opposite the process volume.

19. An apparatus for processing a substrate, comprising
   a chamber body defining a process volume having sidewalls, wherein a major axis of the process volume is oriented vertically and a minor axis of the process volume is oriented horizontally;
   a first plurality of fluid ports formed in the sidewalls of the chamber body;
   a second plurality of fluid ports formed in the sidewalls of the chamber body opposite the first plurality of fluid ports along the major axis of the process volume;
   a moveable door coupled to the chamber body;
   a vacuum chuck having a heating element disposed therein coupled to the door;
   a sliding vacuum seal coupled to sidewalls of the chamber body and at least partially defining a portion of the process volume;
   a plurality of moveable electrodes disposed in the process volume opposite the vacuum chuck;
   a plurality of shafts extending from the plurality of electrodes, the shafts extending through the sliding seal into a cavity disposed opposite the process volume; and
   a motor coupled to the plurality of shafts.

20. The apparatus of claim 19, wherein the plurality of shafts connect at a common shaft, and wherein the common shaft is coupled to the motor.

\* \* \* \* \*